(12) United States Patent
Arriola

(10) Patent No.: US 7,450,300 B2
(45) Date of Patent: Nov. 11, 2008

(54) HIGH RESOLUTION OBJECTIVE LENS ASSEMBLY

(75) Inventor: Edmund W. Arriola, Huntington Beach, CA (US)

(73) Assignee: Newport Corporation, Irvine, CA (US)

( * ) Notice: Subject to any disclaimer, the term of this patent is extended or adjusted under 35 U.S.C. 154(b) by 198 days.

(21) Appl. No.: 10/537,681

(22) PCT Filed: Dec. 4, 2003

(86) PCT No.: PCT/US03/38654

§ 371 (c)(1),
(2), (4) Date: Jun. 3, 2005

(87) PCT Pub. No.: WO2004/053534

PCT Pub. Date: Jun. 24, 2004

(65) Prior Publication Data

US 2006/0087725 A1   Apr. 27, 2006

Related U.S. Application Data

(60) Provisional application No. 60/431,370, filed on Dec. 6, 2002.

(51) Int. Cl.
*G02B 21/02* (2006.01)
(52) U.S. Cl. ...................................... 359/366
(58) Field of Classification Search ................... 359/366
See application file for complete search history.

(56) References Cited

U.S. PATENT DOCUMENTS

| 6,208,459 B1 | 3/2001 | Coon et al. | 359/355 |
| 6,483,638 B1 * | 11/2002 | Shafer et al. | 359/351 |
| 2001/0048083 A1 * | 12/2001 | Hagiwara | 250/492.22 |

* cited by examiner

*Primary Examiner*—Joshua L Pritchett
(74) *Attorney, Agent, or Firm*—Stoel Rives LLP

(57) ABSTRACT

A high resolution objective lens assembly (20, 120, 220, 320) is implemented with refractive lens elements made of modified fused silica for operation at deep ultraviolet (DUV) wavelengths to reduce birefringence-caused image aberrations. The high resolution is achieved by an optical design that is characterized by a very high numerical aperture (NA) and short wavelength operation.

7 Claims, 13 Drawing Sheets

US 7,450,300 B2

HIGH RESOLUTION OBJECTIVE LENS ASSEMBLY

RELATED APPLICATION

This application is a 371 of International Application No. PCT/US03/038654, filed Dec. 4, 2003, which claims benefit of U.S. Provisional Patent Application No. 60/431,370, filed Dec. 6, 2002.

TECHNICAL FIELD

This invention relates to high resolution lens design and, in particular, to a high resolution objective lens assembly formed with refractive components that are substantially free from image-distorting intrinsic birefringence effects exhibited by calcium fluoride ($CaF_2$) at wavelengths shorter than 193 nm.

BACKGROUND OF THE INVENTION

A microlithographic lens is a high resolution lens used in the manufacture of semiconductor devices. The microlithographic objective lens forms images carried by light propagating from a reticle illuminated by a laser and incident on a silicon wafer coated with a photoresist material. State of the art lithographic optical systems use a 193 nm ArF excimer laser to illuminate the reticle. A high resolution microlithographic objective lens ideally causes fractional magnification of the image carried by the light in the absence of significant image-distorting aberrations to form an image in fine detail. The formation of images in fine detail enables the manufacture of high density semiconductor devices. High resolution lens performance can be achieved by one or both of decreasing the wavelength of image-carrying light and increasing the numerical operature (NA) of the objective lens.

Calcium fluoride is a crystalline material typically used in the manufacture of lens components of 193 nm lithography tools. Intrinsic birefringence of calcium fluoride crystal material presents a serious threat to the optical performance of very high NA 157 nm lithography tools. What is needed, therefore, is a high resolution objective lens that is formed with optical components made from alternative refractive lens materials that degrade to a lesser degree the optical performance of the tool in which the lens is incorporated.

SUMMARY OF THE INVENTION

An object of the invention is to provide a high resolution objective lens assembly operating at deep ultraviolet wavelengths, such as 157 nm, formed with refractive components that are substantially free from image-distorting inherent birefringence effects of a kind exhibited by calcium fluoride at 157 nm.

The present invention is a high resolution objective lens assembly implemented with refractive lens elements made of modified fused silica for operation at deep ultraviolet (DUV) wavelengths to reduce birefringence-caused image aberrations. DUV wavelengths are included within a range of between 100 nm and 200 nm. The high resolution is achieved by an optical design that is characterized by a very high numerical aperture and short wavelength operation and is operated with lens substrates having low intrinsic birefringence.

Birefringence effects can be very significant in calcium fluoride. The intrinsic birefringence of calcium fluoride at 157 nm is −11 nm/cm, the effects of which can be appreciable optical path errors. Although judicious orientation of crystal axes during the manufacture of the lenses can mitigate optical path errors, birefringence effects remain problematic at the high light ray angles of incidence associated with high numerical aperture optics. The birefringence of modified fused silica, which is sometimes referred to as fluoridated silica or specially doped fused silica, is virtually negligible; therefore, modified fused silica does not exhibit optical performance limiting effects of intrinsic birefringence. Fluoridated fused silica is available from lens glass suppliers, such as Asahi Glass Co., Tokyo, Japan.

A higher index of refraction lens substrate material produces less spherical aberration and is more effective in correcting optical aberrations. Modified fused silica has at 157.6299 nm a higher refractive index (1.660413) than the refractive index (1.559279) of calcium fluoride.

Preferred embodiments of the lens assembly include a lens used in a lithographic tool for the manufacture of semiconductor devices, in microscopy, and in metrology. The invention is described with reference to four optical design implementations of a preferred microlithographic objective lens operating at 157 nm light emitted by an $F_2$ excimer laser. The four optical assemblies implementing the optical design of the microlithographic lens embodiment exhibit very high NA values in operation with an $F_2$ excimer laser emitting 157 nm light. They include 1.30 NA, all-refractive and 1.10 NA, catadioptric lens assemblies for liquid immersed operation and 0.90 NA, all-refractive and 0.80 NA, catadioptric lens assemblies for dry operation. Dry operation includes lens operation in a vacuum environment or in nitrogen or other gas environment. The refractive lens components are made of modified fused silica. The preferred choice of lens design depends on the spectral bandwidth of the laser, the ability to control temperature in the operating environment, and optical substrate quality.

Additional aspects and advantages of this invention will be apparent from the following detailed description of preferred embodiments thereof, which proceeds with reference to the accompanying drawings.

DETAILED DESCRIPTION OF PREFERRED EMBODIMENTS

A preferred embodiment of the present invention is a very high NA microlithographic objective lens assembly designed for operation at 157 nm wavelength light emitted by an $F_2$ excimer laser. This preferred embodiment has four preferred optical design implementations, two of which are for use with an image plane immersed in a heavily fluorinated liquid as a preferred immersion liquid and two of which are for use with a dry image plane (in vacuum or nitrogen). The optical design implementations include an all-refractive fused silica lens assembly for liquid immersed operation, an all-refractive fused silica lens assembly for dry operation, a catadioptric lens assembly for liquid immersed operation, and a catadioptric lens assembly for dry operation.

The four optical designs are characterized by the following system parameters treated as optimization targets during optical design optimization. The numerical apertures for the lens assemblies designed for liquid immersed operation and dry operation are 1.30 and 0.90, respectively. The field of view (FOV) is between about 60 μm and 100 μm in diameter, and the magnification is fixed between 20× and 200×. Each of the four optical designs causes fractional magnification of the object at the image plane. Therefore, the specification of 49×, 59×, 65×, and 46× design magnifications of these optical designs refers to, respectively, 0.0204×, 0.0170×, 0.0154×, and 0.0217× reductions of the size of the object at the image plane. The lens material is modified fused silica, and the immersion liquid is nominally less than 80 μm thick with a 1.380 refractive index.

Figure 1A:
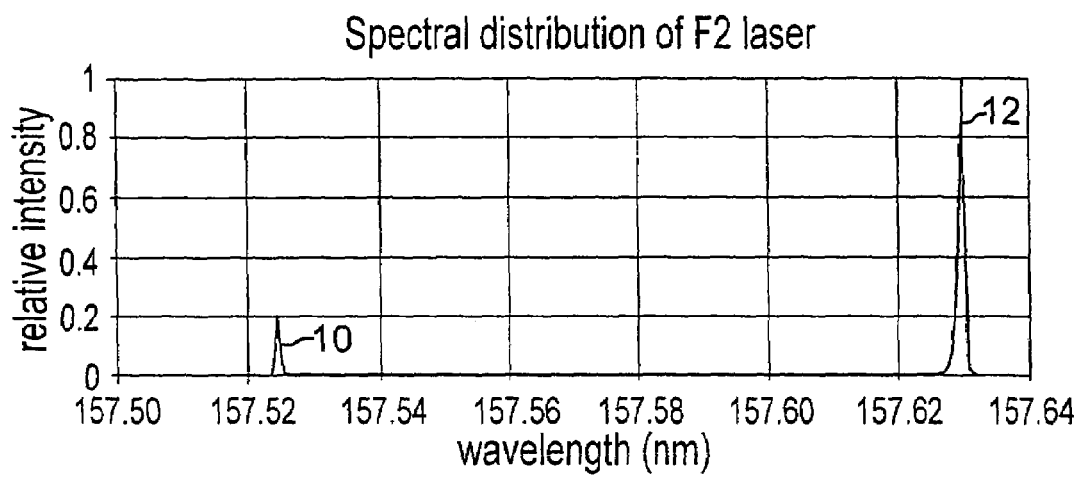
FIGS. 1A and 1B show the spectral distributions of, respectively, an $F_2$ excimer laser and its strong line centered at 157.6299 nm.
Figure 1B:
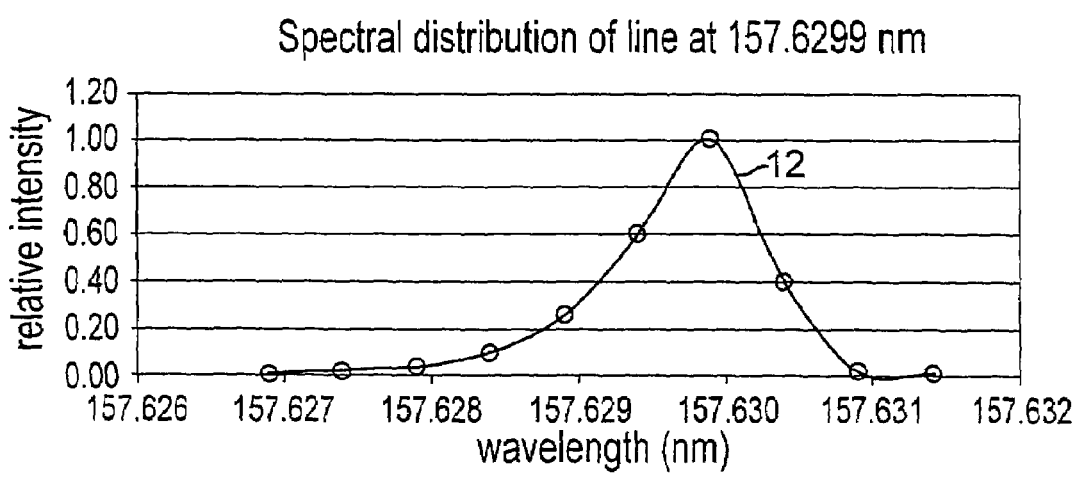

Accurate evaluation of the performance of a lens entails establishing a set of spectral weights that meaningfully sample the spectral continuum of the $F_2$ excimer laser used to produce the image-carrying light propagating through the lens. Table 1 and FIGS. 1A and 1B summarize the spectral weighting used in the evaluations of the four preferred optical design implementations. Table 1 and FIGS. 1A and 1B indicate that there is a combination of a weak spectral line 10 at 157.5245 nm and strong spectral line 12 at 157.6299 nm that extend over 100 pm of spectral wave band. Strong spectral line 12 alone has a full-width at half-maximum (FWHM) of approximately 1 pm. Variability in the central wavelength of the $F_2$ lasers resulting from normal changes in operating parameters is less than approximately 0.02 pm. Because all-refractive single-material optical designs cannot correct for chromatic aberration, they were optimized monochromatically at the peak wavelength (157.6299 nm) of strong spectral line 12 but evaluated over the ten spectral weightings indicated in FIG. 1B.

TABLE 1

Spectral weights for $F_2$ excimer laser

| Δλ (pm) from peak | λ (nm) | weight |
|---|---|---|
| −106.4 | 157.5235 | 0.01 |
| −105.9 | 157.5240 | 0.07 |
| −105.4 | 157.5245 | 0.20 |
| −104.9 | 157.5250 | 0.07 |
| −104.4 | 157.5255 | 0.01 |
| −103.9 | 157.5260 | 0.00 |
| −3.5 | 157.6264 | 0.00 |
| −3.0 | 157.6269 | 0.01 |
| −2.5 | 157.6274 | 0.02 |
| −2.0 | 157.6279 | 0.04 |
| −1.5 | 157.6284 | 0.10 |
| −1.0 | 157.6289 | 0.26 |
| −0.5 | 157.6294 | 0.60 |
| 0.0 | 157.6299 | 1.00 |
| 0.5 | 157.6304 | 0.40 |
| 1.0 | 157.6309 | 0.02 |
| 1.5 | 157.6314 | 0.01 |

The refractive components of the lenses are made of modified fused silica, the absolute refractive indices for which are provided by the National Institute for Standards and Technology (NIST). Table 2 presents a comparison of refractive index at 157.6299 nm in vacuum and spectral dispersion (dn/dλ).

TABLE 2

| | Lens Material | |
|---|---|---|
| Optical Parameter | Modified Fused Silica ($SiO_2$) | Calcium Fluoride ($CaF_2$) |
| Refractive index at 157.6299 nm in vacuum | 1.660413 | 1.559279 |
| Spectral dispersion (dn/dλ) ($nm^{-1}$) | −0.004978 | −0.002601 |

Table 2 shows that the magnitude of the spectral dispersion parameter of modified fused silica is greater than that of calcium fluoride. Although it affects chromatic aberration, spectral dispersion is not a performance limiting parameter because of the magnifications and focal lengths of the modified fused silica-based lens designs used.

The four optical designs are based on the absolute refractive indices. The immersion liquid is modeled as having a 1.380 refractive index. The four optical design implementations described below represent objective lens assemblies produced to achieve an optimal optical performance based on the optical parameters identified above.

Figure 2A:
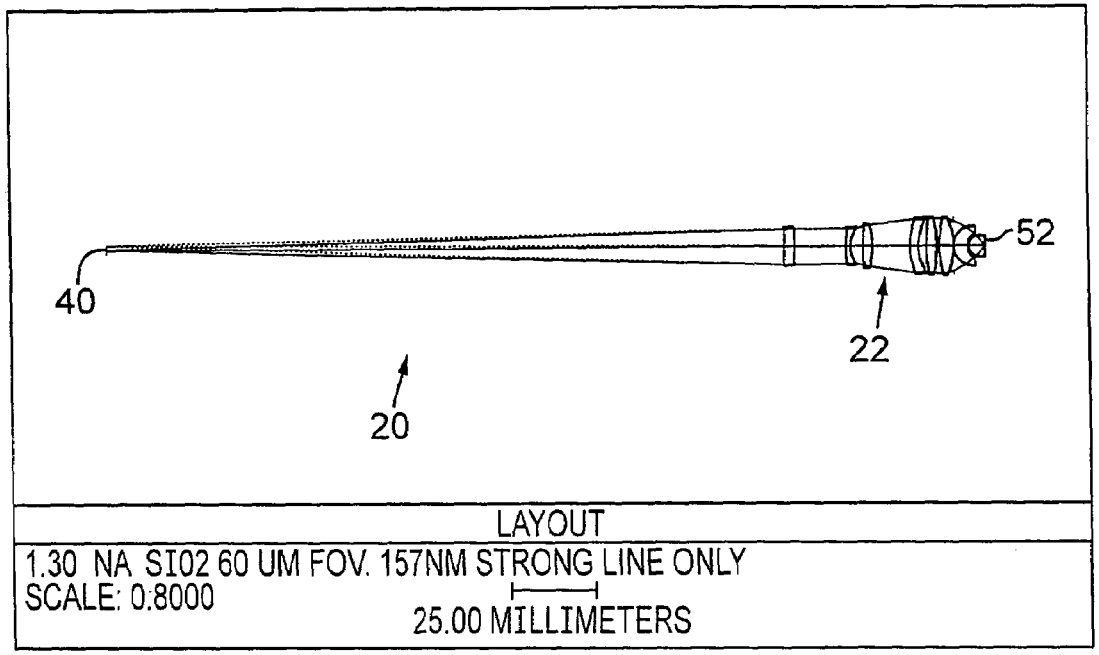
FIGS. 2A and 2B are, respectively, complete and enlarged partial optical layouts of a 1.30 NA, all-refractive optical element lens assembly for liquid immersed operation in accordance with the invention.
Figure 2B:
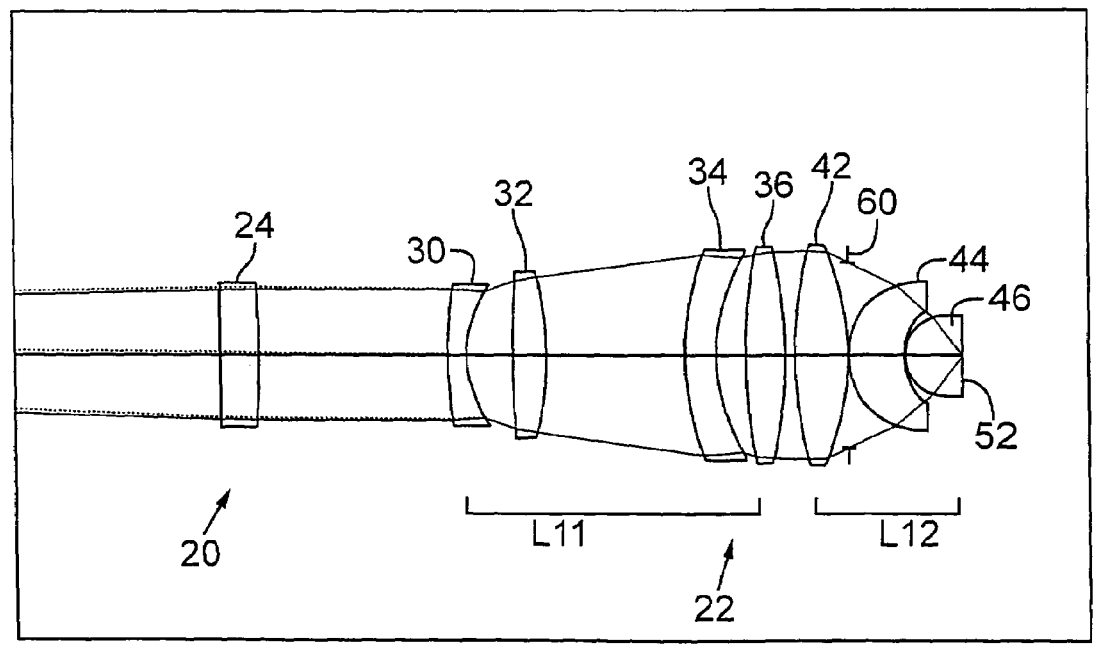

FIGS. 2A and 2B are, respectively, complete and enlarged partial optical layouts of a 1.30 NA, 49× all-refractive modified fused silica optical component lens assembly for liquid immersed operation. With reference to FIGS. 2A and 2B, a 1.30 NA all-refractive optical element lens assembly 20 includes a seven-element infinity-corrected objective lens assembly 22, together with a tube lens 24. Tube lens 24 has a 200 mm focal length and allows a quasi-collimated beam space between tube lens 24 and objective lens assembly 22. The design magnification is approximately 49×. The overall length of lens assembly 20 is approximately 59 mm, and the total track length from the object plane to the image plane is 259 mm. Each of the eight optical elements is made from modified fused silica. The lens curvatures and spacings are optimized to reduce aberrations over a 60 μm diameter FOV. Because the lens design is implemented with refractive elements made of modified fused silica, optical performance is not limited by the intrinsic birefringence of lens substrates such as calcium fluoride. Moreover, because the modified fused silica has a higher index of refraction than that of calcium fluoride, it is more effective in correcting optical aberrations.

Objective lens assembly 22 includes a first lens group L11 and a second lens group L12. First lens group L11 includes four aberration correction and compensation lens elements 30, 32, 34, and 36 that receive light rays carrying a subject image produced by a reticle placed at an object plane 40 and collimated by tube lens 24. Tube lens 24 is positioned an axial distance of sufficient amount away from lens element 30 to provide between them a quasi-collimated space for insertion of miscellaneous optional optical components. The light illuminating the reticle is emitted by a 157 nm $F_2$ excimer laser having the spectral characteristics shown in FIGS. 1A and 1B and presented in Table 1. The $F_2$ excimer laser is line selected to eliminate weak spectral line 10. Convex-concave lens element 30 and convex-convex lens element 32 cooperate to provide spherical aberration correction and compensation. Lens element 30 is axially movable to compensate for manufacturing errors in lenses and lens housing dimension errors. Convex-concave lens element 34 and convex-convex element 36 cooperate also to provide spherical aberration correction and compensation. Lens element 34 also functions as an X-Y (decenter) compensator.

Second lens group L12 includes three converging lens elements 42, 44, and 46 that receive the light rays propagating from first lens group L11 and converge the subject image-carrying light rays to form a magnified aberration-corrected image at an image plane 52. Lens elements 42, 44, and 46 form a lens triplet that turns the light rays inward without introducing excess aberrations for which the components of first lens group L11 cannot compensate.

An aperture stop 60 is positioned between concave-convex lens element 42 and convex-concave lens element 44 to restrict the diameter of the axial light bundle passing through lens elements 42 and 44 of second lens group L12. Convex-piano lens element 46 has resident on its piano exit surface 52 a thin liquid interface film to provide lens assembly 22 with a numerical aperture of greater than 1.0. The immersion liquid used provides a 1.30 numerical aperture for the 157 nm light. The magnified image at image plane 52 is produced by fractional magnification of the subject image to enable printing in the layer of photoresist an image in small, fine detail.

Table 3 represents the optical prescription for lens assembly 20. The surface number represents an optical surface appearing in sequential order from the object plane to the image plane. The thickness represents the distance between next adjacent surfaces. A surface with a specification of a glass type indicates a thickness distance between entrance and exit surfaces of a lens element. The radius represents the radius of curvature of a surface, and the diameter represents the surface diameter. All dimensions are expressed in mm.

TABLE 3

1.30 NA liquid immersion objective lens assembly and tube lens

| Surface number | Radius of curvature (mm) | Axial distance (mm) | Glass type | Diameter (mm) |
|---|---|---|---|---|
| OBJECT | Infinity | 200.00000 | | 2.94000 |
| 1 | Infinity | 3.00000 | $SiO_2$ | 11.60334 |
| 2 | −133.27470 | 15.00000 | | 11.67728 |
| 3 | 33.90697 | 1.50000 | $SiO_2$ | 11.43874 |
| 4 | 9.96689 | 3.70640 | | 11.06726 |

TABLE 3-continued 1.30 NA liquid immersion objective lens assembly and tube lens

| Surface number | Radius of curvature (mm) | Axial distance (mm) | Glass type | Diameter (mm) |
|---|---|---|---|---|
| 5 | 101.43370 | 2.66667 | $SiO_2$ | 12.81442 |
| 6 | −26.98699 | 11.05576 | | 13.44765 |
| 7 | 23.98842 | 2.38248 | $SiO_2$ | 17.11761 |
| 8 | 15.81624 | 2.43150 | | 16.68719 |
| 9 | 48.42182 | 3.06236 | $SiO_2$ | 17.34385 |
| 10 | −38.78077 | 0.78596 | | 17.66730 |
| 11 | 36.13428 | 4.16456 | $SiO_2$ | 17.85699 |
| 12 | −22.15478 | 0.03333 | | 17.61776 |
| STOP | Infinity | 0.12000 | | 15.15400 |
| 14 | 6.41105 | 4.31448 | $SiO_2$ | 12.15981 |
| 15 | 4.85417 | 0.15000 | | 7.71512 |
| 16 | 3.30785 | 4.54696 | $SiO_2$ | 6.57450 |
| 17 | Infinity | 0.06666 | LIQUID | 6.57450 |
| IMAGE | Infinity | | | |

Objective lens assembly 22 having a 49× magnification and evaluated at 157.6299 nm allows covering a 60 μm FOV with a wavefront error of less than 0.030 wave rms on-axis and less than 0.057 wave rms at the FOV edge (excluding manufacturing and alignment errors). The dominant aberrations are spherical aberration, astigmatism, and longitudinal chromatic aberration. Distortion is less than 0.002 percent. At 49× magnification, the 60 μm FOV at the image plane requires a source size of approximately 3 mm at the $F_2$ excimer laser source. Similarly, the numerical aperture of approximately 1.30 at the image plane requires a source divergence of approximately 27 milliradians half angle.

Figure 3:
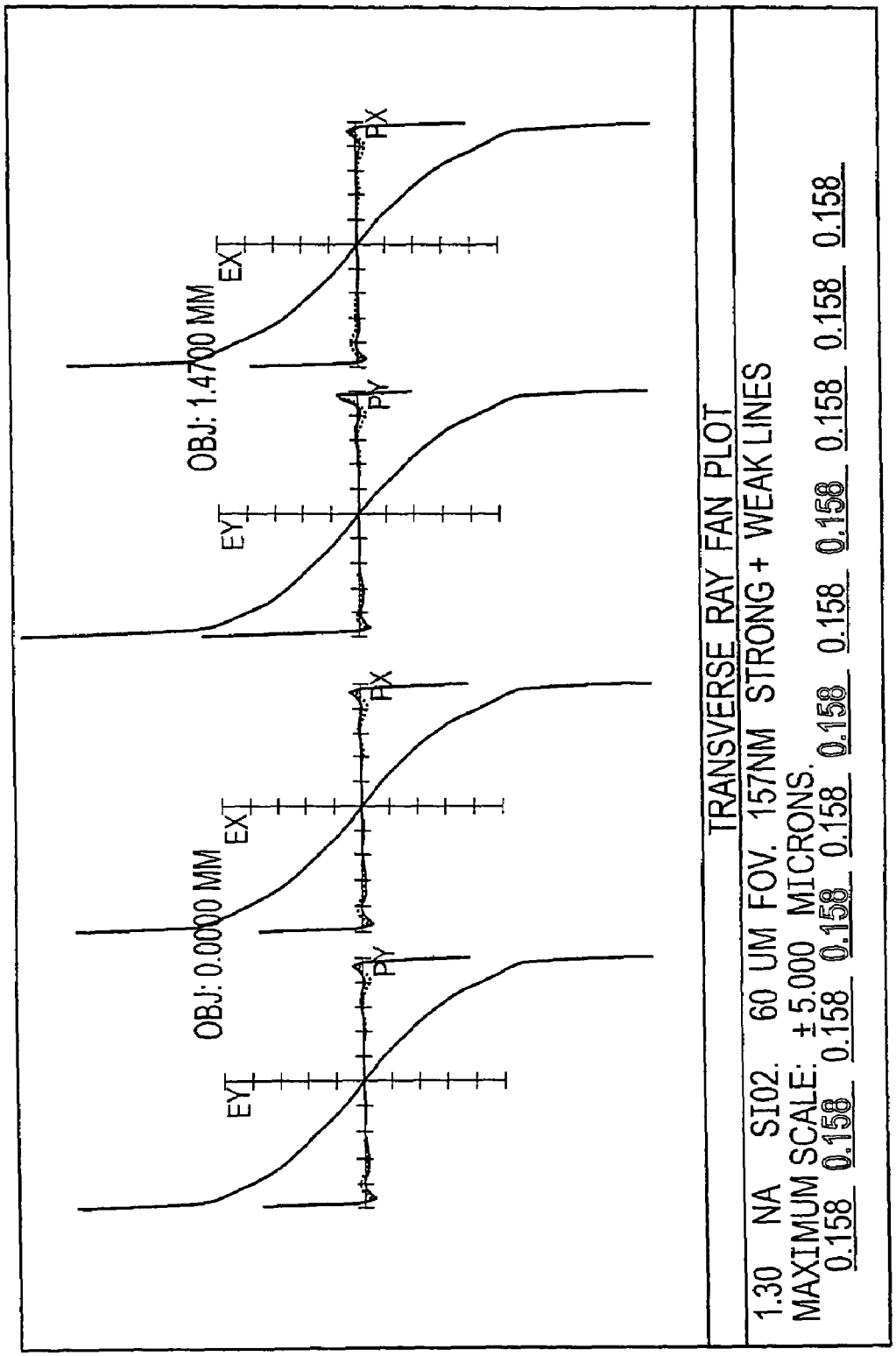
FIG. 3 is a transverse ray fan plot graphically illustrating the nominal optical performance of the lens assembly of FIGS. 2A and 2B.

FIG. 3 shows a ray fan plot graphically illustrating the magnitude of geometric aberrations at the image plane for orthogonal fans of rays incident on the entrance pupil. The vertical axis of the plot represents transverse aberration, and the horizontal axis represents pupil coordinate along the x and y axes in the lens coordinate space. (The optical axis is along the z axis.)

Figure 4:
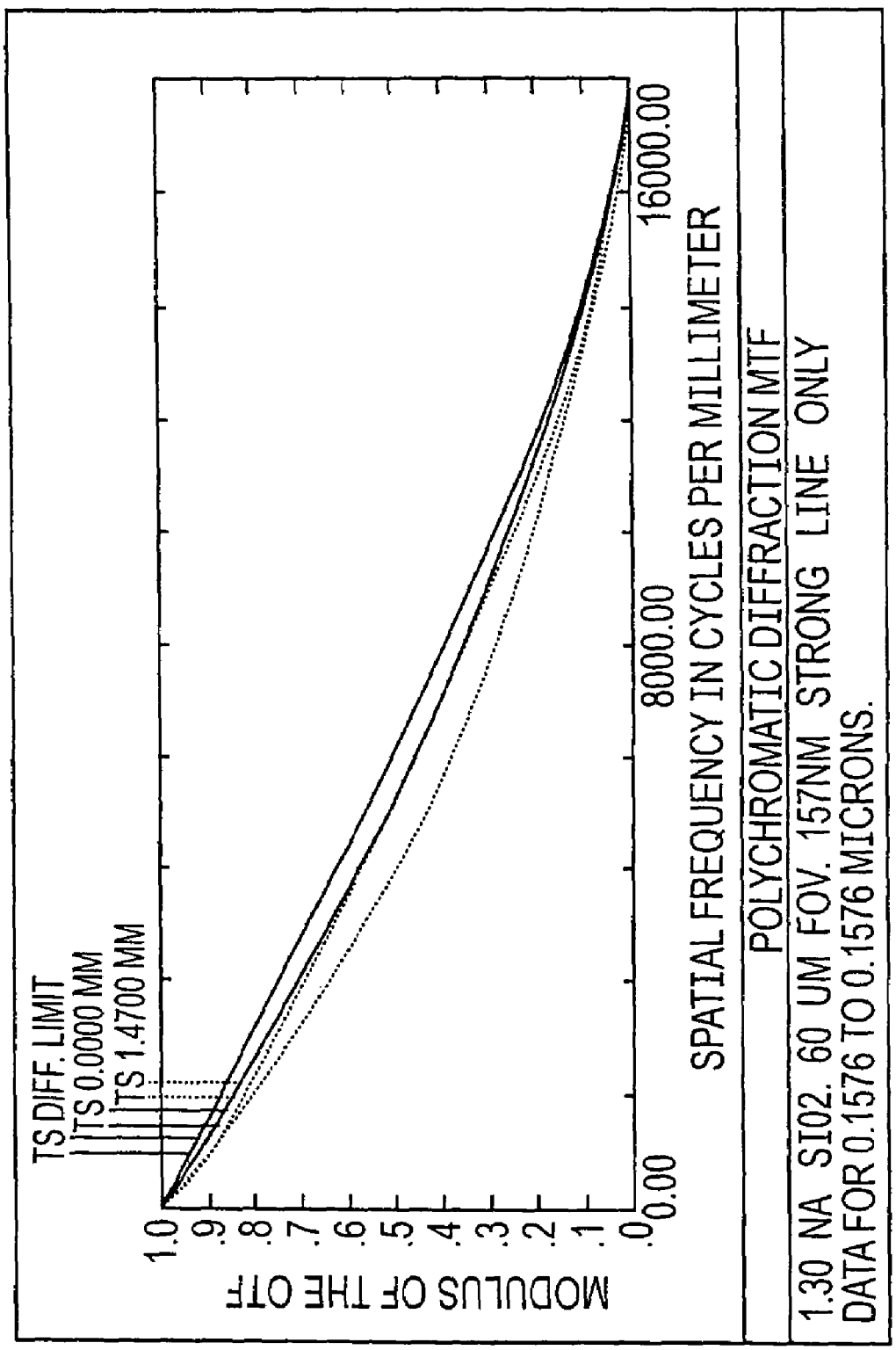
FIG. 4 is a polychromatic diffraction Modulation Transfer Function (MTF) plot illustrating the nominal optical performance of the lens assembly of FIGS. 2A and 2B over the full spectrum of the strong line at 20° C.

The very steep line in the ray fan plot of FIG. 3 represents very large aberrations resulting from weak spectral line 10 of 157.5245 nm. The ray fan plot makes evident a need for excluding weak spectral line 10 in the all-refractive optical component design implementations. The amount of longitudinal chromatic aberration in the 49× magnification all-refractive modified fused silica optical component design contributes 0.049 wave rms over a 1 pm FWHM spectral bandwidth, which dictates use of a line-selected laser. FIG. 4, which is a plot of the polychromatic diffraction MTF for strong spectral line 12 at 20° C., shows that this amount of residual aberration appears to be allowable.

Figure 5A:
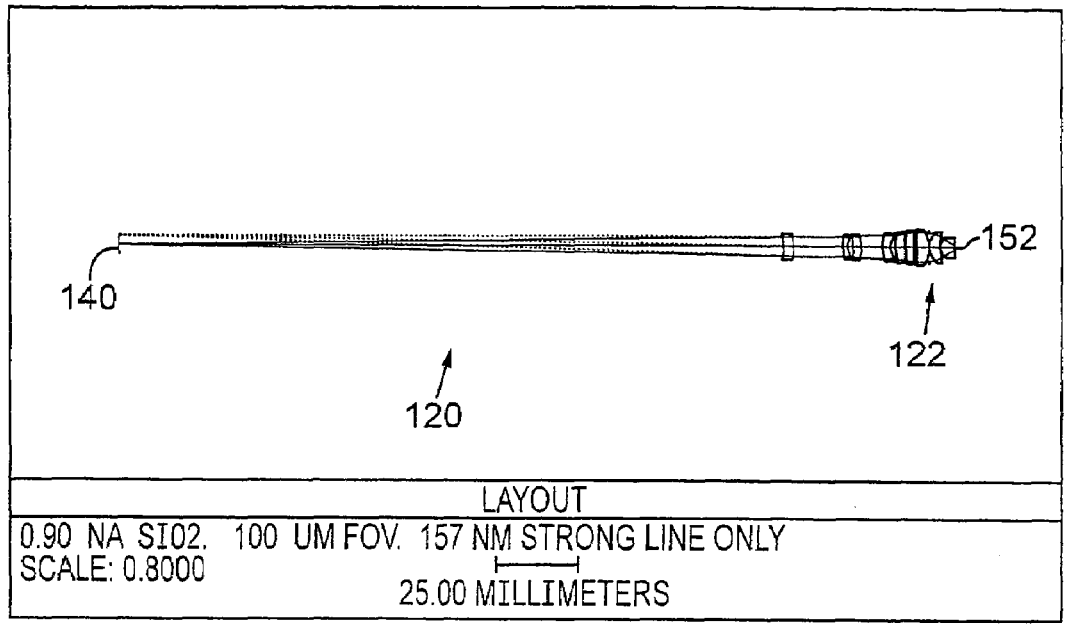
FIGS. 5A and 5B are, respectively, complete and enlarged partial optical layouts of a 0.90 NA, all-refractive optical element lens assembly for dry operation in accordance with the invention.
Figure 5B:
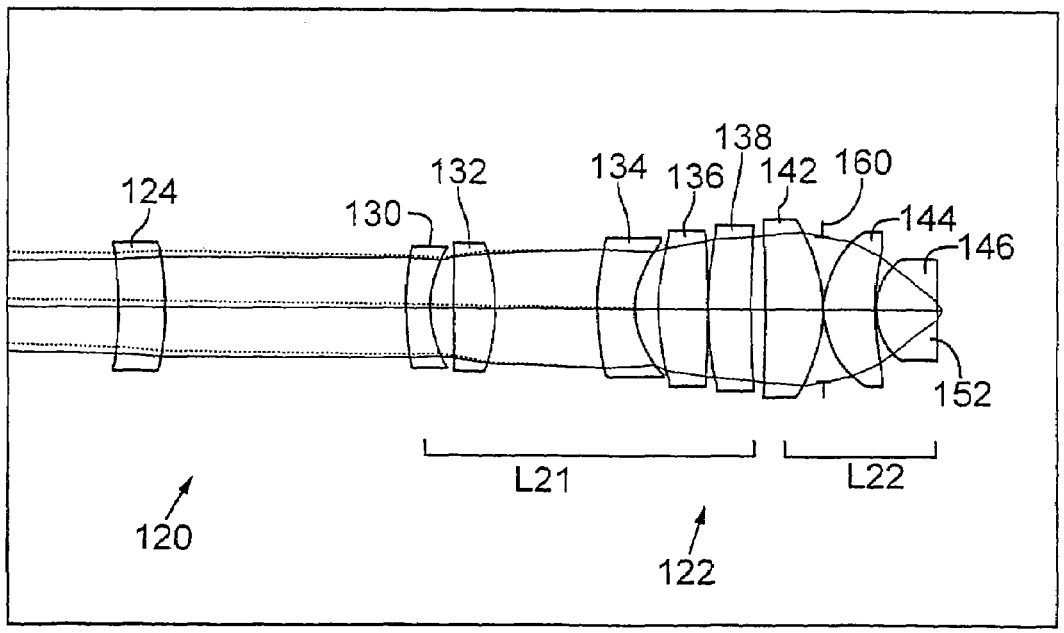

FIGS. 5A and 5B are, respectively, complete and enlarged partial optical layouts of a 0.90 NA, 59× all-refractive modified fused silica optical component lens assembly for dry operation. With reference to FIGS. 5A and 5B, a 0.90 NA all-refractive optical element lens assembly 120 includes an eight-element infinity-corrected objective lens assembly 122, together with a tube lens 124. The design magnification is approximately 59×. The overall length of lens assembly 120 is approximately 52 mm, and the total track length from the object plane to the image plane is 252 mm. The back working distance is 311 μm. Each of the nine optical elements is made from modified fused silica. The optical design prescription of lens assembly 120 for dry operation is similar in form to that of lens assembly 20 for liquid immersed operation.

Objective lens assembly 122 includes a first lens group L21 and a second lens group L22. First lens group L21 includes five aberration correction and compensation lens elements 130, 132, 134, 136, and 138 that receive light rays carrying a subject image produced by a reticle placed at an object plane 140 and collimated by tube lens 124. Second lens group L22 includes three converging lens elements 142, 144, and 146 that receive the light rays propagating from first lens group L21 and converge the subject image-carrying light rays to form a magnified aberration-corrected image at an image plane 152. An aperture stop 160 is positioned between lens elements 142 and 144 of second lens group L22. The NA of optical assembly 120 is less than the 1.0 value achieved by optical assembly 20 because of the absence of immersion liquid at exit surface 152 of lens element 146.

Table 4 represents the optical prescription for lens assembly 120, optimized to operate in vacuum. The descriptions of the nomenclature used in Table 3 also apply to Table 4.

TABLE 4

0.90 NA modified fused silica dry objective lens assembly and tube lens (nine-element design)

| Surface number | Radius of curvature (mm) | Axial distance (mm) | Glass type | Diameter (mm) |
|---|---|---|---|---|
| OBJECT | Infinity | 200.00000 | | 6.00000 |
| 1 | −23.15084 | 3.00000 | SiO$_2$ | 7.93920 |
| 2 | −20.92973 | 15.00000 | | 8.35301 |
| 3 | 18.76323 | 1.50000 | SiO$_2$ | 7.83330 |
| 4 | 6.77281 | 1.48888 | | 7.45441 |
| 5 | 910.58440 | 2.66667 | SiO$_2$ | 7.83016 |
| 6 | −12.49536 | 6.56589 | | 8.51902 |
| 7 | 17.83024 | 2.38248 | SiO$_2$ | 9.12191 |
| 8 | 6.38213 | 1.44813 | | 8.61736 |
| 9 | 18.42919 | 3.06236 | SiO$_2$ | 9.37613 |
| 10 | −125.35550 | 0.06667 | | 10.31366 |
| 11 | 26.19697 | 2.66667 | SiO$_2$ | 10.63181 |
| 12 | 73.72596 | 0.86294 | | 11.02607 |
| 13 | −176.88840 | 3.64530 | SiO$_2$ | 11.26636 |
| 14 | −10.23928 | 0.03333 | | 11.84809 |
| STOP | Infinity | 0.03333 | | 9.60000 |
| 16 | 5.97064 | 3.31448 | SiO$_2$ | 10.18745 |
| 17 | 18.89625 | 0.06667 | | 8.20673 |
| 18 | 4.27599 | 3.69650 | SiO$_2$ | 6.65179 |
| 19 | 3.25273 | 0.38333 | | 1.54652 |
| IMAGE | Infinity | | | |

Table 5 represents the optical prescription for a seven-element objective lens assembly, together with a tube lens, as an alternative to lens assembly 120, which has one additional lens element.

TABLE 5

0.90 NA modified fused silica dry objective lens assembly and tube lens (eight-element design)

| Surface number | Radius of curvature (mm) | Axial distance (mm) | Glass type | Diameter (mm) |
|---|---|---|---|---|
| OBJECT | Infinity | 200.00000 | | 6.000 |
| 1 | −22.59016 | 3.00000 | SiO$_2$ | 6.900 |
| 2 | −20.52452 | 15.00000 | | 7.270 |
| 3 | 19.48466 | 1.50000 | SiO$_2$ | 6.814 |
| 4 | 6.72330 | 1.48888 | | 6.492 |
| 5 | Infinity | 2.66667 | SiO$_2$ | 6.826 |
| 6 | −12.39167 | 6.56589 | | 7.458 |
| 7 | 15.59444 | 2.38248 | SiO$_2$ | 8.146 |
| 8 | 6.57587 | 1.44813 | | 8.946 |
| 9 | 19.28444 | 3.06236 | SiO$_2$ | 8.222 |
| 10 | −102.57643 | 2.75154 | | 8.946 |

TABLE 5-continued 0.90 NA modified fused silica dry objective lens assembly and tube lens (eight-element design)

| Surface number | Radius of curvature (mm) | Axial distance (mm) | Glass type | Diameter (mm) |
|---|---|---|---|---|
| 11 | −424.34310 | 3.64530 | SiO$_2$ | 10.138 |
| 12 | −10.26960 | 0.03333 | | 10.704 |
| STOP | Infinity | 0.03333 | | 10.106 |
| 14 | 6.11908 | 3.41201 | SiO$_2$ | 9.304 |
| 15 | 16.73348 | 0.06667 | | 7.558 |
| 16 | 4.31284 | 4.01398 | SiO$_2$ | 6.160 |
| 17 | 3.25048 | 0.40220 | | 1.400 |
| IMAGE | Infinity | | | |

Because of the slower NA of 0.90 as compared with 1.30, the dry design has reduced wavefront errors, which allow for a 100 μm FOV. Although it has slightly improved chromatic wavefront errors as compared with optical assembly 20, optical assembly 120 operates with the exclusion of weak spectral line 10 of the F$_2$ excimer laser.

Figure 6:
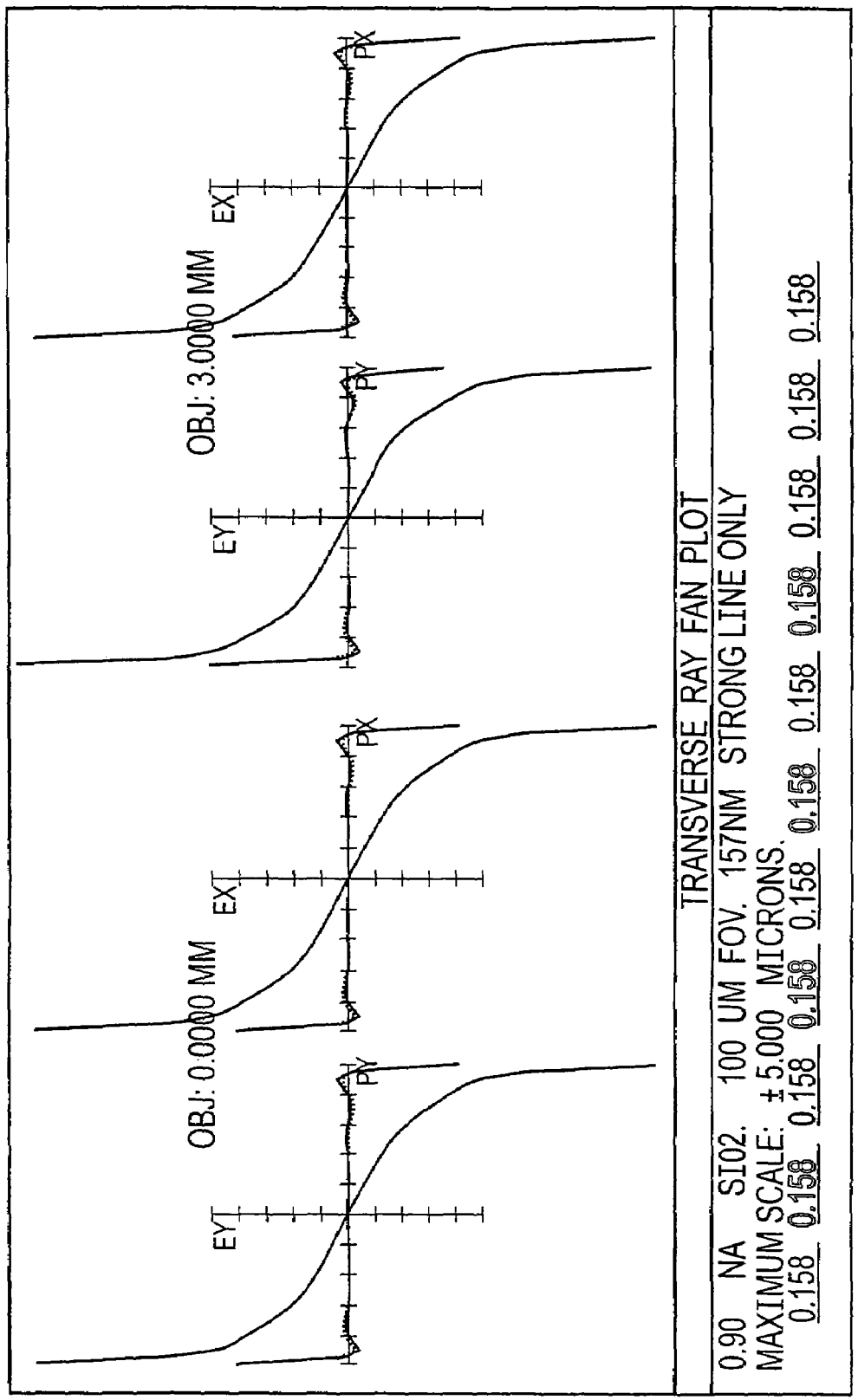
FIGS. 6 and 7 are, respectively, a transverse ray fan plot and a polychromatic diffraction MTF plot illustrating the nominal optical performance of the lens assembly of FIGS. 5A and 5B for the strong line centered at 157.6299 nm.
Figure 7:
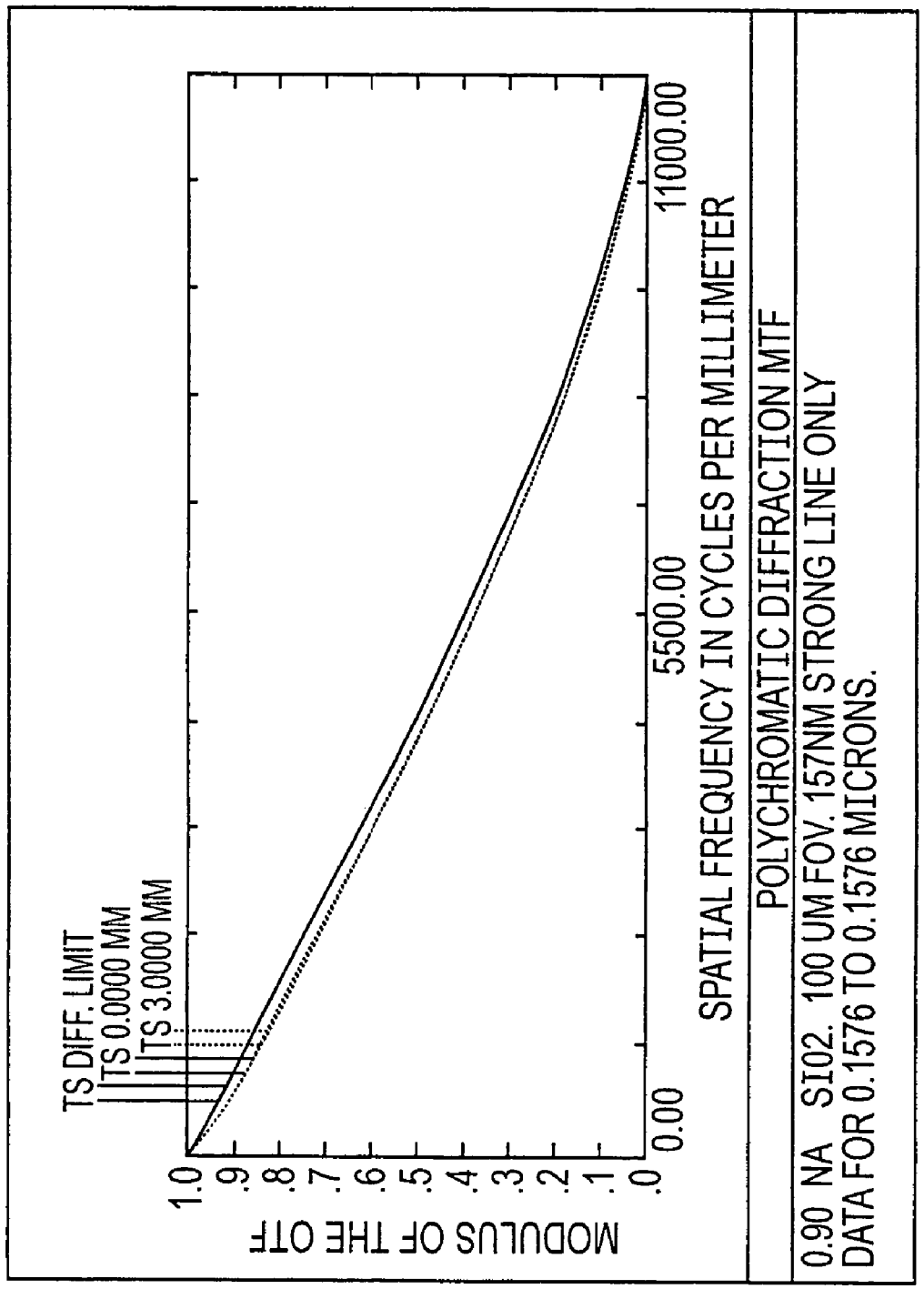

The nominal performance of lens assembly 120 is summarized in FIGS. 6 and 7, which are, respectively, a transverse fan ray plot and an MTF plot. Distortion of lens assembly 120 is less than 0.005 percent.

Figure 8A:
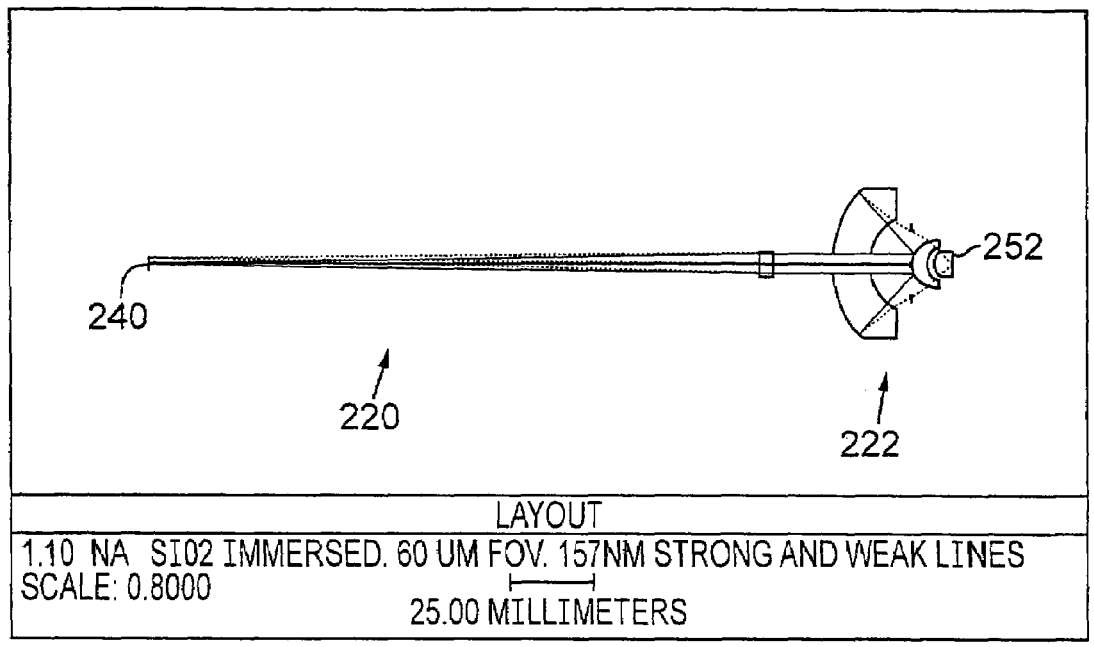
FIGS. 8A and 8B are, respectively, complete and enlarged partial optical layouts of a 1.10 NA, catadioptric lens assembly for liquid immersed operation in accordance with the invention.
Figure 8B:
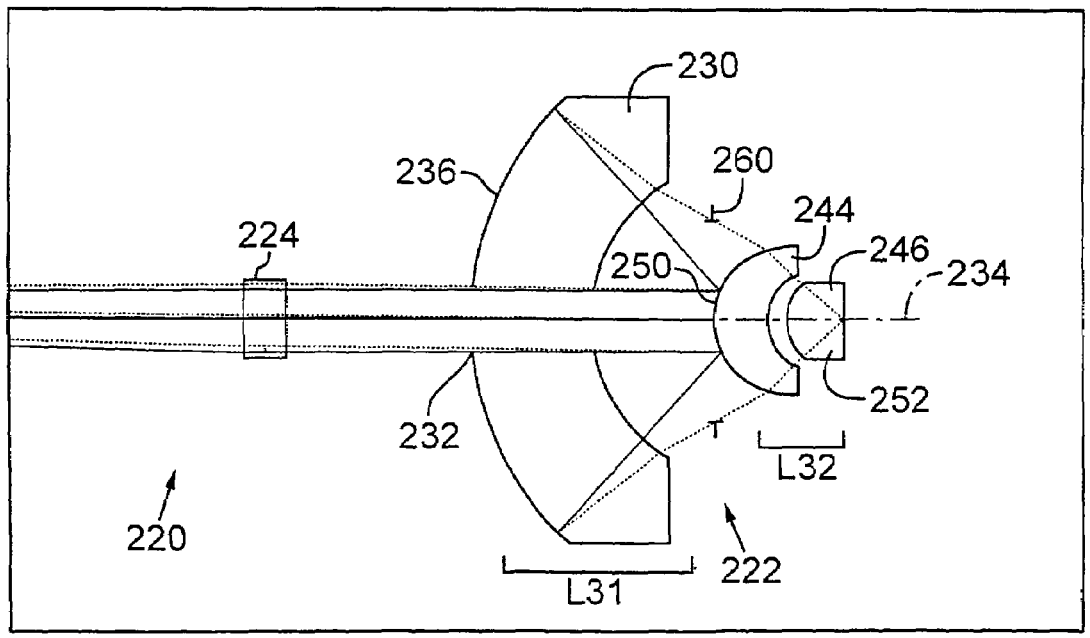

FIGS. 8A and 8B are, respectively, complete and enlarged partial optical layouts of a 1.10 NA, 65× catadioptric lens assembly for liquid immersed operation. The catadioptric lens form combines mirrors with refractive lens components to extend the chromatic aberration correction to allow the use of a free-running F$_2$ excimer laser. The reduction in NA from 1.30 to 1.10 as compared with the all-refractive lens element design is a tradeoff for operational immunity to weak spectral line 10.

With reference to FIGS. 8A and 8B, a 1.10 NA, catadioptric lens assembly 220 includes a three-element objective lens assembly 222, together with a tube lens 224. Tube lens 224 has a 180 mm focal length. The design magnification is 65×. The overall length of lens assembly 220 is approximately 57 mm, and the total track length from the object plane to the image plane is 237 mm. Each of the four refractive elements is made from modified fused silica.

Objective lens assembly 222 includes a one-element first lens group L31 and a second lens group L32. First lens group L31 includes a lens element 230 that receives through a central aperture 232 light rays carrying a subject image produced by a reticle placed at an object plane 240 and collimated by tube lens 224. Central aperture 232 is of circular shape with its center aligned with an optical axis 234 of lens assembly 220. The light illuminating the reticle is emitted by a free-running 157 nm F$_2$ laser having the spectral characteristics shown in FIGS. 1A and 1B and presented in Table 1. Lens element 230 is a bowl-shaped perforated meniscus lens, the thickness and curvature of which are set to correct for astigmatism, coma, and spherical aberrations. The perforation defines central aperture 232. An entrance surface 236 of lens element 230 is mirror coated to reflect light rays incident on it.

Second lens group L32 includes two converging lens elements 244 and 246 that receive the light rays propagating through central aperture 232 of single-lens element group L31 and, in cooperation with reflective surface 236 of lens element 230, converge the image-carrying light rays to form a magnified aberration corrected image at an image plane 252. Convex-concave lens element 244 carries on its entrance surface 248 an aluminum coated central mirror spot 250, the center of which is aligned with optical axis 234. Central mirror spot 250 receives the light rays propagating through central aperture 232 and reflects them back toward reflective surface 236, which in turn reflects them for incidence on entrance surface 248 of lens element 244 in an annular region outside of central mirror spot 250. The light incident on lens element 244 outside of central mirror spot 250 propagates through lens element 244 and convex-plano lens element 246, which turn the light rays inward for convergence at image plane 252.

An aperture stop 260 is positioned between lens elements 230 and 244. Lens element 246 has resident on its piano exit surface 252 a thin liquid interface film to provide lens assembly 220 with a numerical aperture of greater than 1.0, specifically 1.10 NA at 157 nm.

Table 6 represents the optical prescription for lens assembly 220. The descriptions of the nomenclature used in Table 3 also apply to Table 6. The rightmost column indicates the value of the conic constant.

TABLE 6

1.10 NA liquid immersion catadioptric objective lens assembly and tube lens

| Surface number | Radius of curvature (mm) | Axial distance (mm) | Glass type | Diameter (mm) | Conic (mm) |
|---|---|---|---|---|---|
| OBJECT | Infinity | 180.00000 | | 3.89310 | |
| 1 | 62.45144 | 4.00000 | SiO$_2$ | 7.53802 | |
| 2 | 129.57920 | 41.00000 | | 7.39378 | |
| 3 | 7.28119 | −11.72200 | MIRROR | 6.43604 | |
| 4 | 16.29926 | −11.78142 | SiO$_2$ | 27.20000 | |
| 5 | 30.41378 | 11.78142 | MIRROR | 43.96928 | −0.004073 |
| 6 | 16.29926 | 11.72200 | | 27.20000 | |
| STOP | Infinity | 0.00000 | | 19.82600 | |
| 8 | 7.28119 | 5.02034 | SiO$_2$ | 14.65805 | |
| 9 | 4.87627 | 1.93577 | | 9.00390 | |
| 10 | 5.11145 | 5.37460 | SiO$_2$ | 7.51977 | |
| 11 | Infinity | 0.05000 | LIQUID | 7.51977 | |
| IMAGE | Infinity | | | | |

The catadioptric lens design for liquid immersed operation is operable up to an NA of about 1.10, at which point the wavefront error is about 0.05 wave rms. In the design forms described, an NA of 1.2 and an NA of 1.25 cause a wavefront of, respectively, 0.09 wave rms and 0.15 wave rms over an FOV of about 60 μm. The reflective surfaces are mildly aspheric. Combining the refractive and reflective elements, the catadioptric lens design corrects for off-axis and chromatic aberrations and is compatible with a free-running laser that has a bandwidth of greater than 100 pm. Distortion is less than 0.003 percent.

Mirror surface 236 requires a large modified fused silica substrate piece for manufacture, about 18 mm in thickness× 42 mm in diameter. Shortening the focal length (i.e., increasing the magnification) allows for some reduction in element size.

Calcium fluoride may be substituted if the acquisition of large pieces of modified fused silica is problematic; however, the thick substrate would be more susceptible to degradations in image quality resulting from birefringence effects at 157 nm.

Figure 9:
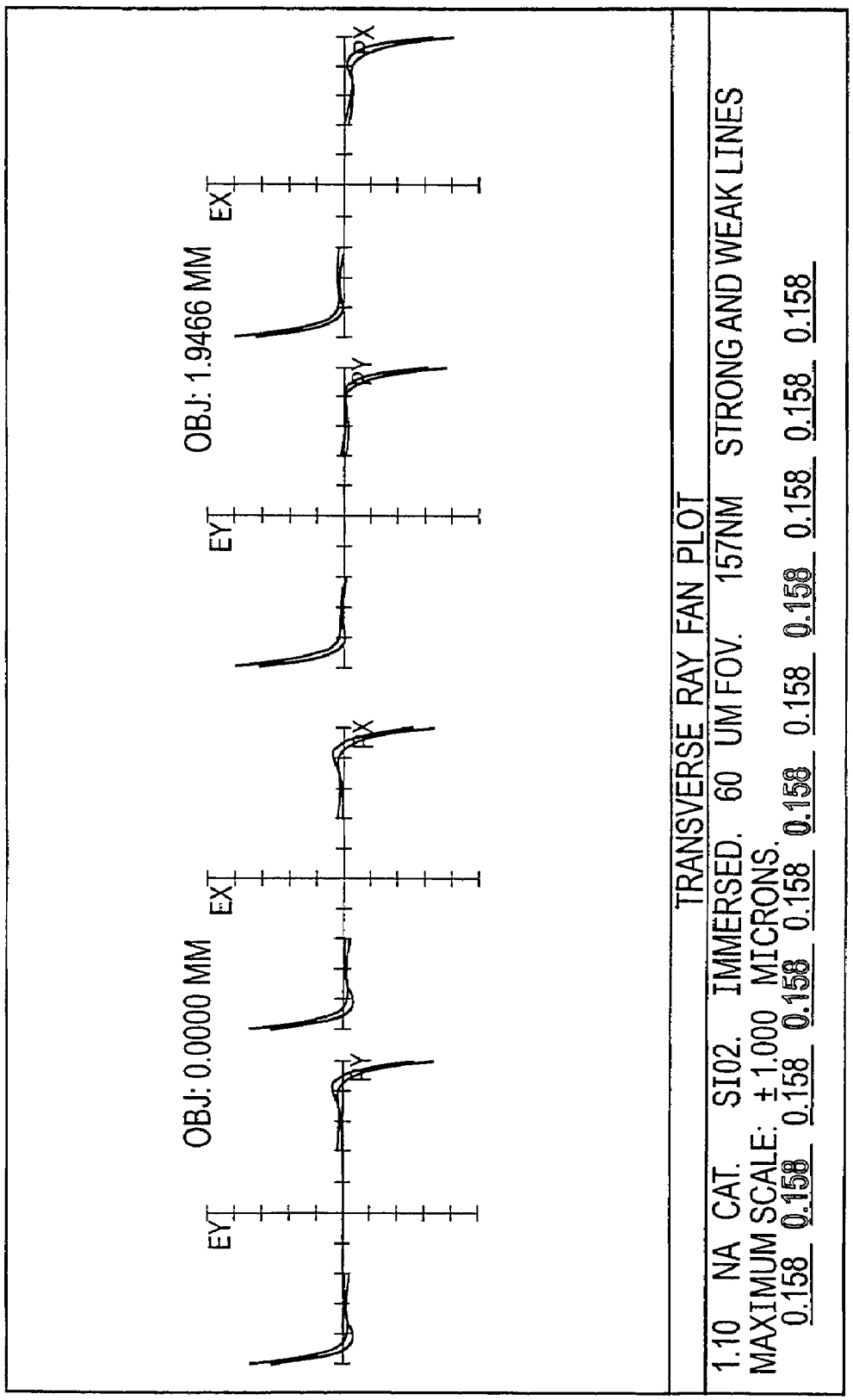
FIGS. 9 and 10 are, respectively, a transverse ray fan plot and a polychromatic diffraction MTF plot illustrating the nominal optical performance of the lens assembly of FIGS. 8A and 8B using the full 100 pm spectral bandwidth of an $F_2$ excimer laser from 157.5 nm to 157.6 nm (including weak and strong lines).
Figure 10:
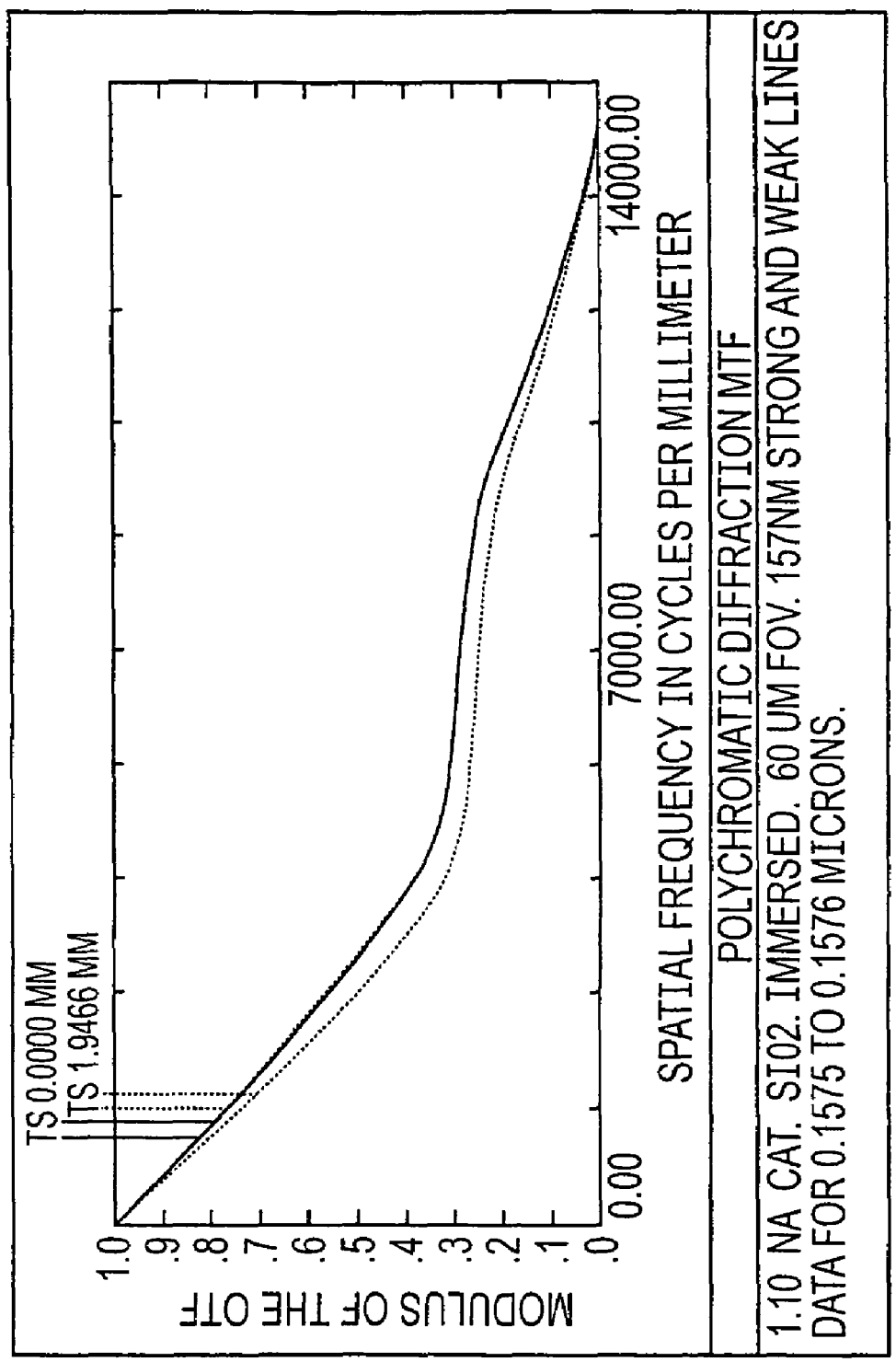

The nominal performance of optical assembly 220 is summarized in FIGS. 9 and 10, which are, respectively, a transverse ray fan plot and an MTF plot. FIG. 10 shows that the central obscuration affects the MTF at midrange spatial frequencies. The presence of a reflective coating 249 on the central area of the smaller lens element 244 eliminates a need for a "spider" support structure that would otherwise increase the amount of obscuration and stray light and thereby degrade system contrast. The catadioptric lens design is passively athermal over several degrees of temperature range, if the optical components are mounted with low expansion materials.

Figure 11A:
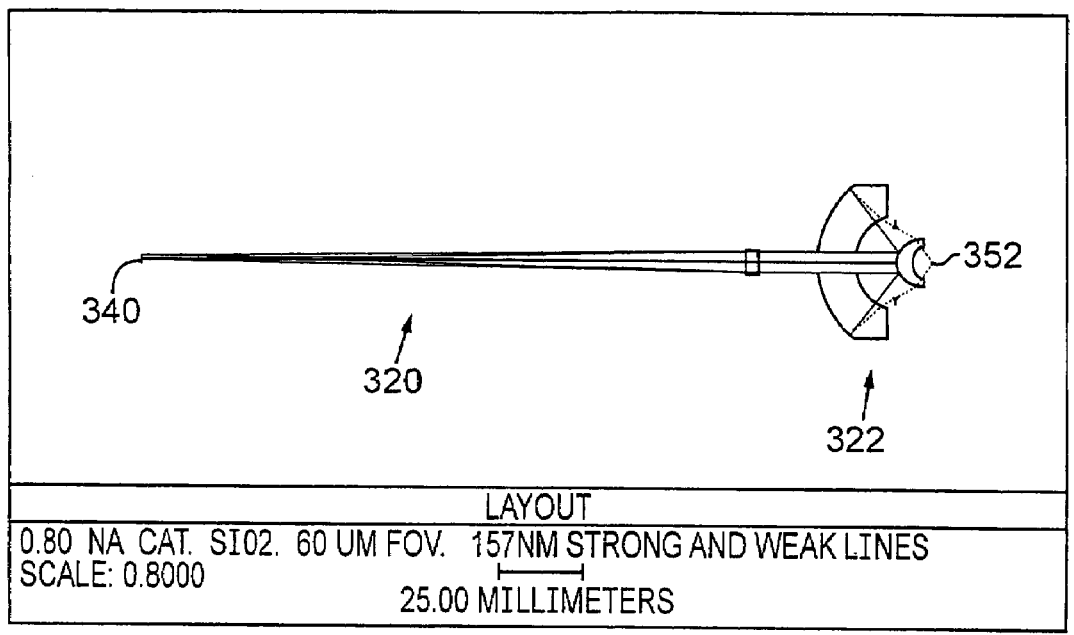
FIGS. 11A and 11B are, respectively, complete and enlarged partial optical layouts of a 0.80 NA, catadioptric lens assembly for dry operation in accordance with the invention.
Figure 11B:
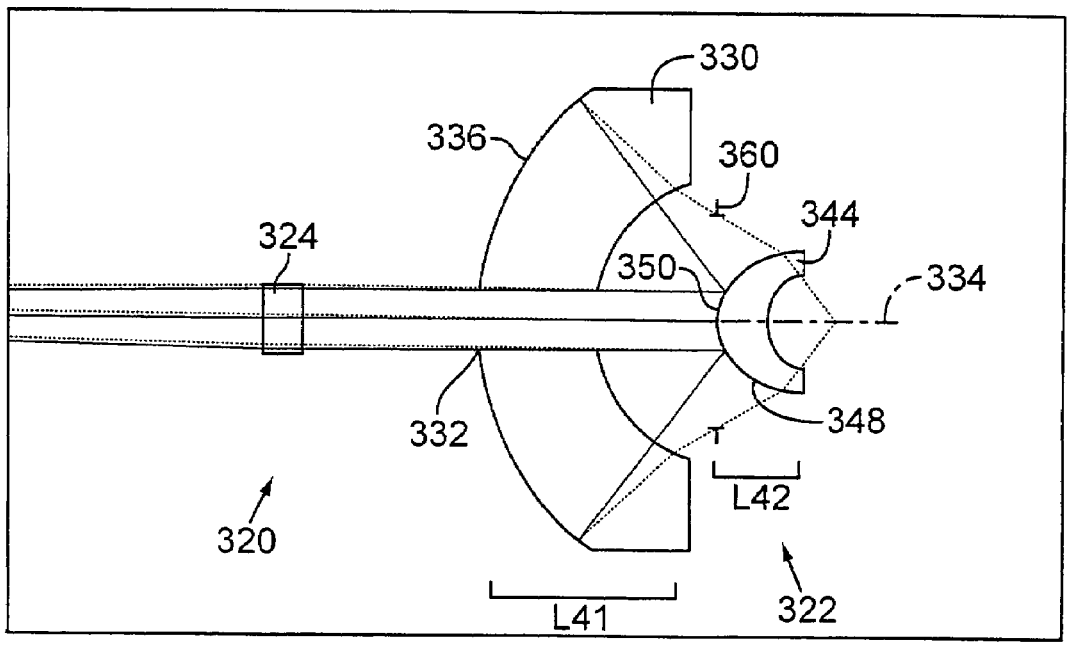

FIGS. 11A and 11B are, respectively, complete and enlarged partial optical layouts of a 0.80 NA, 46× catadioptric lens assembly for dry operation. This catadioptric design is very similar to that of catadioptric lens assembly 220, with the exception that lens element 246 is removed and the optical design is reoptimized for dry operation.

With reference to FIGS. 11A and 11B, a catadioptric lens assembly 320 includes a two-element objective lens assembly 322, together with a tube lens 324. Objective lens assembly 322 includes a one-element first lens group L41 and a one-element second lens group L42. First lens group L41 includes bowl-shaped perforated meniscus lens element 330, and second lens group L42 includes convex-concave lens element 344. An aperture stop 360 is positioned between lens elements 330 and 344. Optical components corresponding to those of optical assembly 220 are identified by the same reference numerals increased by 100.

Table 7 represents the optical prescription for lens assembly 320, optimized to operate in vacuum. Descriptions of the nomenclature used in Table 6 also apply to Table 7.

TABLE 7

0.80 NA catadioptric dry objective lens assembly and tube lens

| Surface number | Radius of curvature (mm) | Axial distance (mm) | Glass type | Diameter (mm) | Conic (mm) |
|---|---|---|---|---|---|
| OBJECT | Infinity | 180.00000 | | 2.77592 | |
| 1 | 72.34379 | 4.00000 | SiO$_2$ | 7.24927 | |
| 2 | 182.59560 | 41.00000 | | 7.14923 | |
| 3 | 6.89904 | −12.05812 | MIRROR | 6.47387 | |
| 4 | 15.31196 | −11.61336 | SiO$_2$ | 28.20000 | |
| 5 | 29.86507 | 11.61336 | MIRROR | 47.00000 | −0.006542 |
| 6 | 15.31196 | 12.05812 | | 28.20000 | |
| STOP | Infinity | 0.00000 | | 21.60000 | |
| 8 | 6.89904 | 4.93134 | SiO$_2$ | 14.32981 | |
| 9 | 5.42709 | 6.53440 | | 10.03609 | |
| IMAGE | Infinity | | | | |

Figure 12:
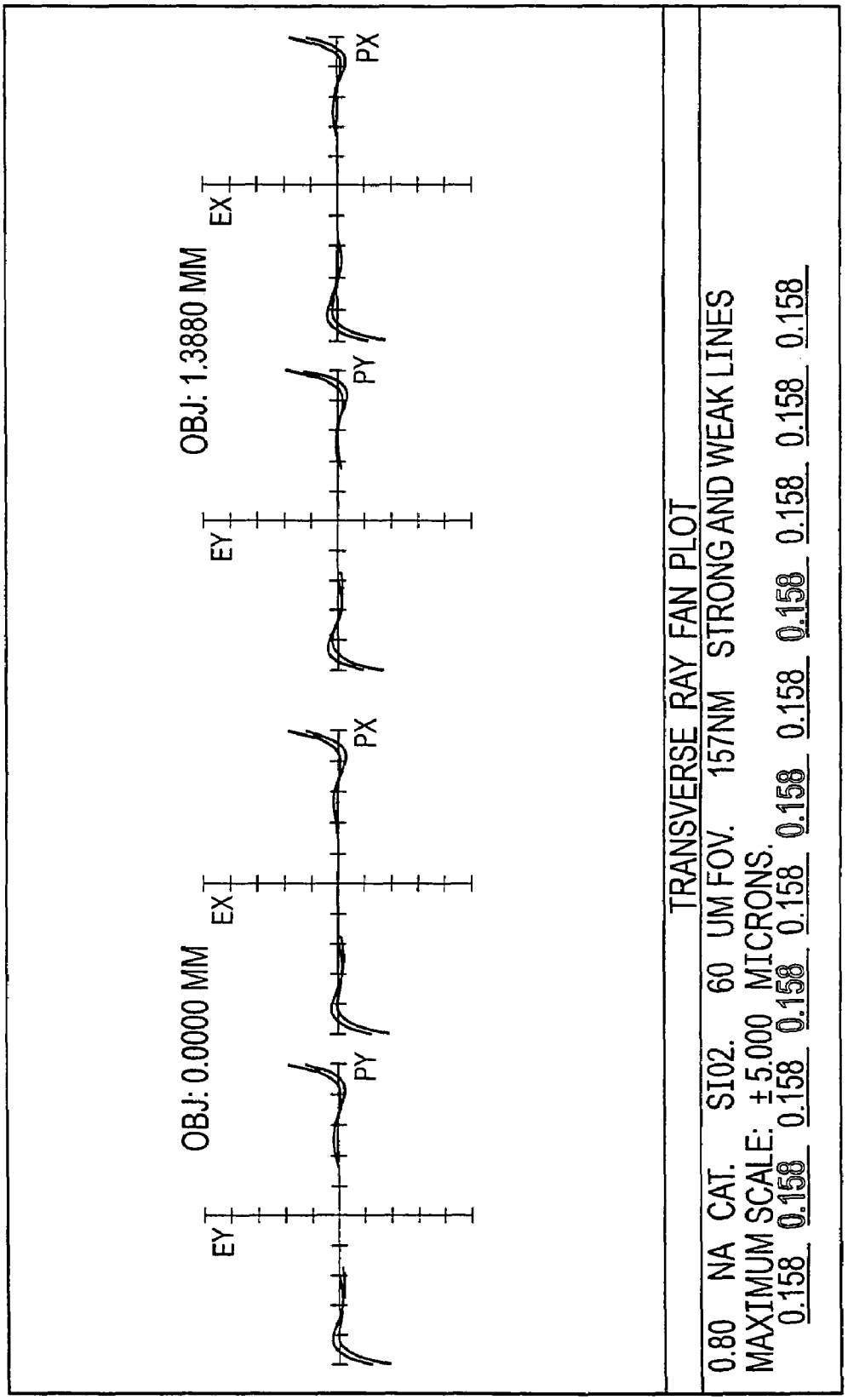
FIGS. 12 and 13 are, respectively, a transverse ray fan plot and a polychromatic diffraction MTF plot illustrating the nominal optical performance of the lens assembly of FIGS. 11A and 11B using the full 100 pm spectral bandwidth of an $F_2$ excimer laser from 157.5 nm to 157.6 nm (including weak and strong lines).
Figure 13:
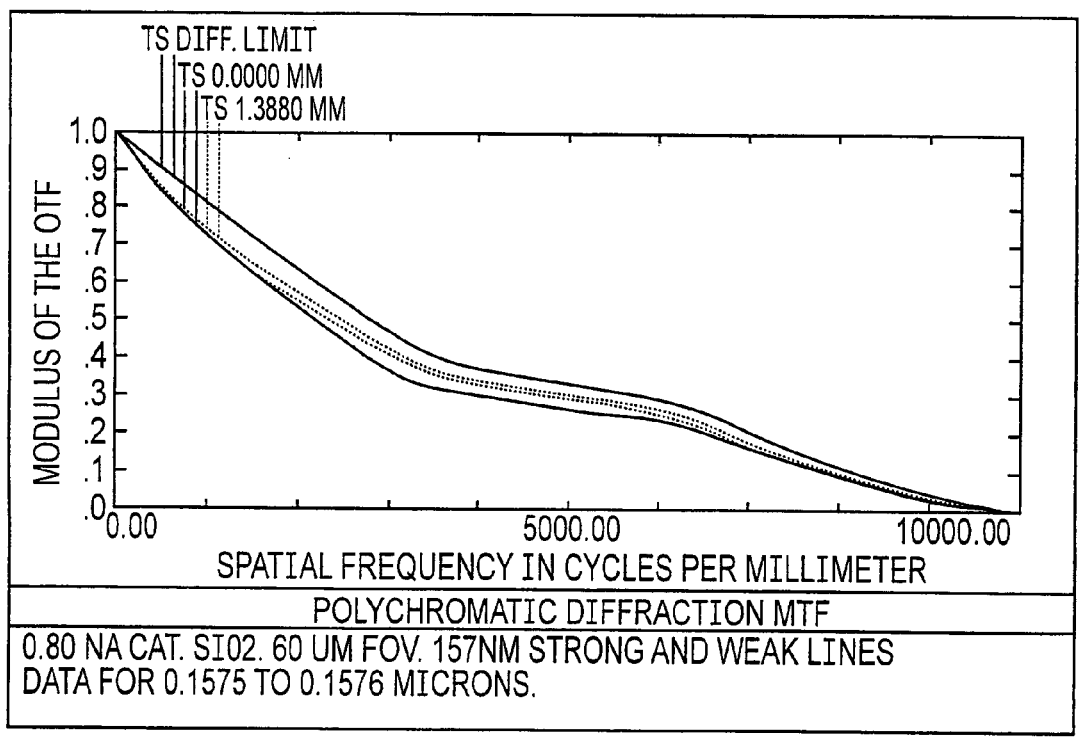

The catadioptric lens design for dry operation is operable up to an NA of about 0.80 with a wavefront error of 0.05 wave rms over a 60 μm diameter FOV. Distortion is less than 0.005 percent. The design is passively athermal over a large temperature range if low expansion housing materials are used. The nominal performance of optical assembly 320 is summarized in FIGS. 12 and 13, which are, respectively, a transverse ray fan plot and an MTF plot.

It will be obvious to those having skill in the art that many changes may be made to the details of the above-described embodiments without departing from the underlying principles of the invention. For example, variations of the basic optical design include adding aspheric surfaces to one or more of the lens elements, adding or eliminating optical elements, and including in part other types of lens materials such calcium fluoride and magnesium fluoride to the lens design. The lens designs presented can be readily reoptimized to operate at 193 nm or lower wavelengths; however, the intrinsic birefringence effects exhibited by calcium fluoride are negligible at 193 nm and longer wavelengths. The scope of the present invention should, therefore, be determined only by the following claims.

The invention claimed is:

1. A high resolution objective lens assembly formed with refractive components that are substantially free from image-distorting intrinsic birefringence effects of a kind exhibited by calcium fluoride operating at 157 nm and cooperate to provide a high numerical aperture lens assembly operating with a specified deep ultraviolet wavelength of light carrying a subject image, comprising:

first and second lens groups including optical components formed of high index of refraction lens element substrate material and cooperating to form a magnified, aberration-corrected image at an image plane, all of the optical components of the first and second lens groups formed of refractive lens materials;

the first lens group including an aberration correction and compensation lens element positioned to receive non-converging light rays of a specified wavelength, the light rays carrying a subject image; and the second lens group including a converging lens clement positioned to receive light rays propagating from the first lens group and converge the light rays carrying the subject image to form the magnified, aberration-corrected image at the image plane, the second lens group including a final lens element having a piano exit surface and a liquid interface film resident at the plano exit surface to provide for the lens assembly a numerical aperture of greater than 1.0.

2. The lens assembly of claim 1, in which the numerical aperture is about 1.30 for a specified wavelength of 157 nm.

3. The lens assembly of claim 1, in which the plano exit surface is positioned in contact with a thin liquid film resident at the image plane.

4. A high resolution objective lens assembly formed with refractive components that are substantially free from image-distorting intrinsic birefringence effects of a kind exhibited by calcium fluoride operating at 157 nm and cooperate to provide a high numerical aperture lens assembly operating with a specified deep ultraviolet wavelength of light carrying a subject image, comprising:

first and second lens groups including optical components of a type arranged in the form of a catadioptric design and formed of high index of refraction lens element substrate material, the first and second lens groups cooperating to form a magnified, aberration-corrected image at an image plane, and each of the first and second lens groups including a lens element comprising a mirror attached to a refractive substrate;

the first lens group including an aberration correction and compensation lens element positioned to receive non-converging light rays of a specified wavelength, the light rays carrying a subject image; and the second lens group being of a compound lens type and including converging and convex-plano lens elements, the converging lens element positioned to receive light rays propagating from the first lens group and converge the light rays carrying the subject image to form the magnified, aberration-corrected image at the image plane, and the convex-plano lens element having a piano exit surface and a liquid interface film resident at the piano exit surface to provide for the lens assembly a numerical aperture of greater than 1.0.

5. The lens assembly of claim 4, in which the piano exit surface is positioned in contact with a thin liquid film resident at the image plane.

6. The lens assembly of claim 4, in which the numerical aperture is about 1.10 for a specified wavelength of 157 nm.

7. The lens assembly of claim 4, in which the second lens group further includes a meniscus lens element having an entrance surface coated with a mirror central spot.

* * * * *